US012628485B2

(12) United States Patent
Li et al.

(10) Patent No.: US 12,628,485 B2
(45) Date of Patent: May 12, 2026

(54) LIGHT-EMITTING CHIP STRUCTURE, DISPLAY DEVICE, AND METHOD FOR MANUFACTURING DISPLAY DEVICE

(71) Applicants: CHONGQING HKC OPTOELECTRONICS TECHNOLOGY CO., LTD., Chongqing (CN); HKC CORPORATION LIMITED, Shenzhen (CN)

(72) Inventors: Zeyao Li, Shenzhen (CN); Baohong Kang, Shenzhen (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 354 days.

(21) Appl. No.: 18/233,900

(22) Filed: Aug. 15, 2023

(65) Prior Publication Data

US 2024/0313037 A1     Sep. 19, 2024

(30) Foreign Application Priority Data

Mar. 13, 2023     (CN) .......................... 202320475736.9

(51) Int. Cl.
*H10H 29/14*          (2025.01)
*H10H 20/01*          (2025.01)
(Continued)

(52) U.S. Cl.
CPC .... *H10H 29/142* (2025.01); *H10H 20/01335* (2025.01); *H10H 20/812* (2025.01);
(Continued)

(58) Field of Classification Search
CPC ........... H10H 29/142; H10H 20/01335; H10H 20/812; H10H 20/8512; H10H 20/0361;
(Continued)

(56) References Cited

U.S. PATENT DOCUMENTS

2022/0384516 A1*  12/2022  Tan ......................... H01L 25/18

FOREIGN PATENT DOCUMENTS

CN          109979958 A  *  7/2019  ........... H10H 29/142
CN          110444560 A     11/2019
(Continued)

OTHER PUBLICATIONS

English translation CN109979958A (Year: 2019).*
International Search Report, International Application No. PCT/CN2023/094542, mailed Oct. 2, 2023 (17 pages).

*Primary Examiner* — Latanya N Crawford Eason

(57)          ABSTRACT

A light-emitting chip structure, a display device, and a method for manufacturing a display device are provided. The light-emitting chip structure includes a protective layer, a buffer layer, an epitaxial layer, a patterned metal layer, a light-shielding layer, and an electrode layer. The epitaxial layer is divided into multiple epitaxial structures by multiple first gaps thereof. A side surface of a first semiconductor layer of the epitaxial layer is arranged with a protruding portion. One part of a patterned metal layer is disposed on a bottom of each of the first gaps to cover the protruding portion and a part of the buffer layer exposed through the first gaps, and the other part of the patterned metal layer is disposed on a side surface of the epitaxial structure at an edge of the light-emitting chip structure and a surface of the epitaxial structure away from the buffer layer.

18 Claims, 7 Drawing Sheets

(51) Int. Cl.

| | |
|---|---|
| *H10H 20/812* | (2025.01) |
| *H10H 20/815* | (2025.01) |
| *H10H 20/851* | (2025.01) |
| *H10H 20/855* | (2025.01) |

(52) U.S. Cl.

CPC ...... *H10H 20/815* (2025.01); *H10H 20/8512* (2025.01); *H10H 20/855* (2025.01); *H10H 20/0361* (2025.01); *H10H 20/0363* (2025.01)

(58) Field of Classification Search

CPC ............... H10H 20/815; H10H 20/855; H10H 20/0363; H10H 20/831; H10H 20/8312; H10H 20/8314; H10H 20/8316; H10H 29/011; H10H 29/14; H10H 29/30; H10H 29/32; H10H 29/34; H10H 29/345; H10H 29/352; H10H 29/362; H10H 29/37; H10H 29/39; H10H 29/41; H10H 29/45; H10H 29/8517; H10H 29/8552; H10H 29/922; H10H 29/942; H10H 29/962; H10H 20/811; H10H 20/8132; H10H 20/8313; H10W 90/15

See application file for complete search history.

(56) References Cited

FOREIGN PATENT DOCUMENTS

| | | |
|---|---|---|
| CN | 111725251 A | 9/2020 |
| CN | 112909038 A | 6/2021 |
| CN | 114512504 A | 5/2022 |

* cited by examiner

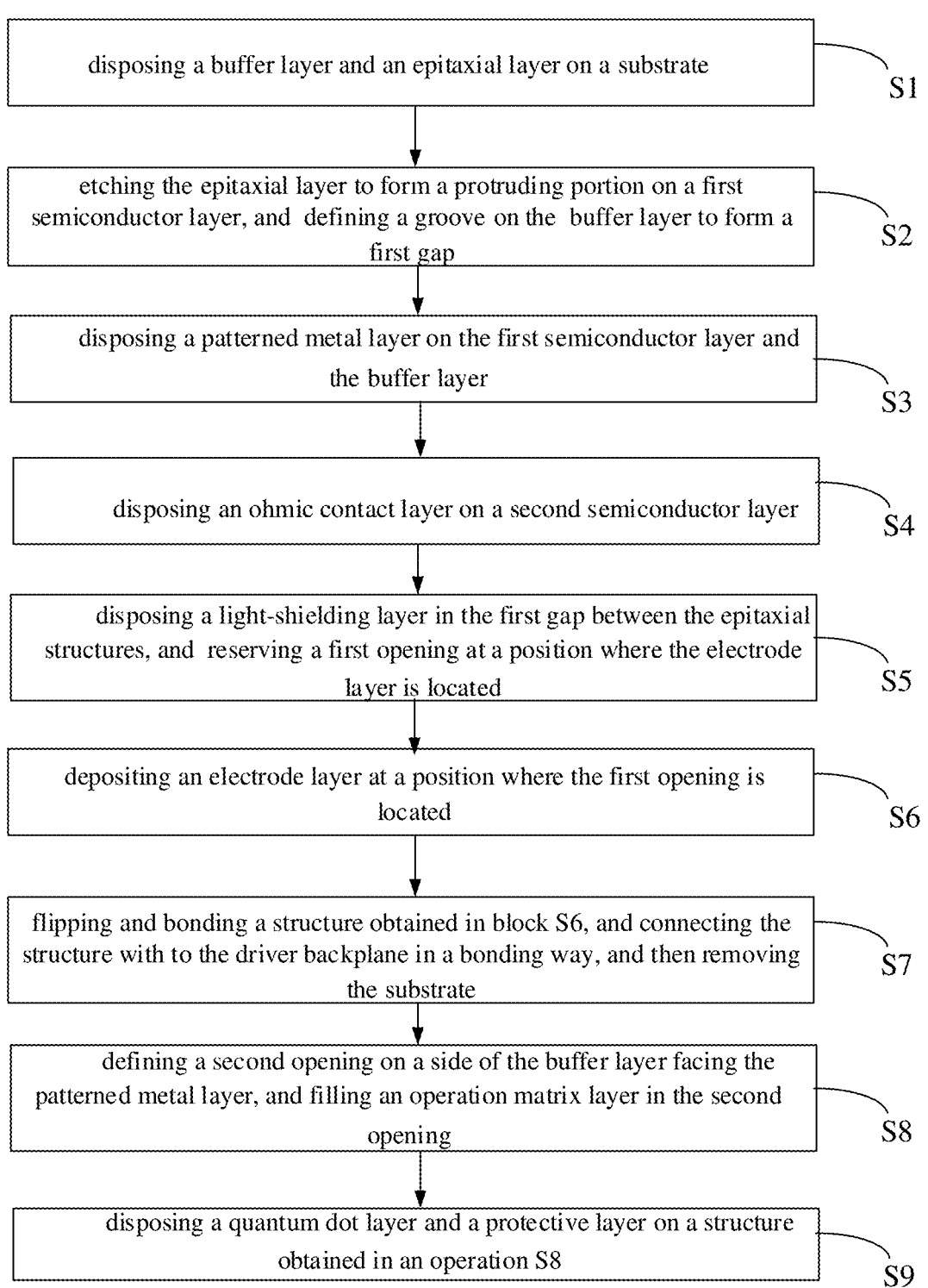

disposing a buffer layer and an epitaxial layer on a substrate — S1 etching the epitaxial layer to form a protruding portion on a first semiconductor layer, and defining a groove on the buffer layer to form a first gap — S2 disposing a patterned metal layer on the first semiconductor layer and the buffer layer — S3 disposing an ohmic contact layer on a second semiconductor layer — S4 disposing a light-shielding layer in the first gap between the epitaxial structures, and reserving a first opening at a position where the electrode layer is located — S5 depositing an electrode layer at a position where the first opening is located — S6 flipping and bonding a structure obtained in block S6, and connecting the structure with to the driver backplane in a bonding way, and then removing the substrate — S7 defining a second opening on a side of the buffer layer facing the patterned metal layer, and filling an operation matrix layer in the second opening — S8 disposing a quantum dot layer and a protective layer on a structure obtained in an operation S8 — S9

FIG. 6

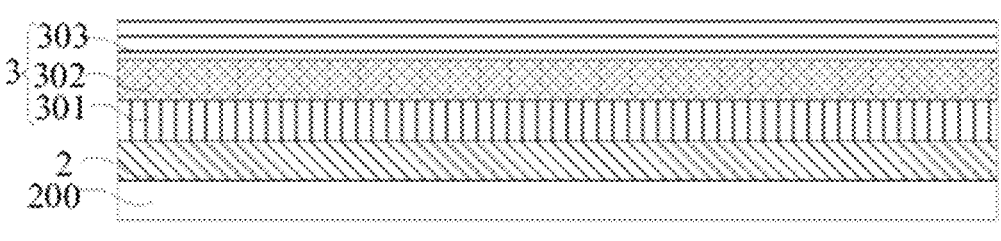
FIG. 7
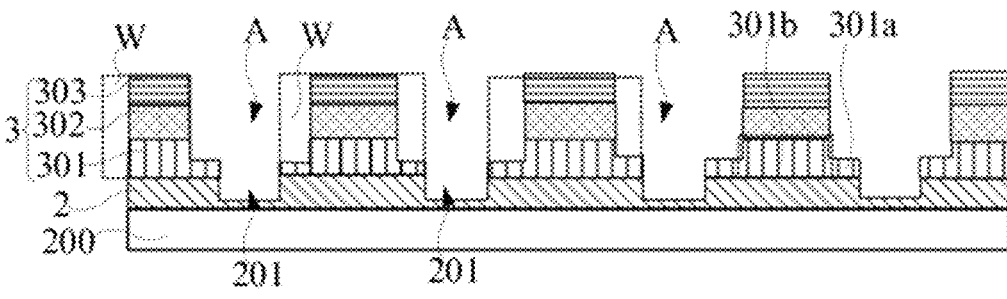
FIG. 8
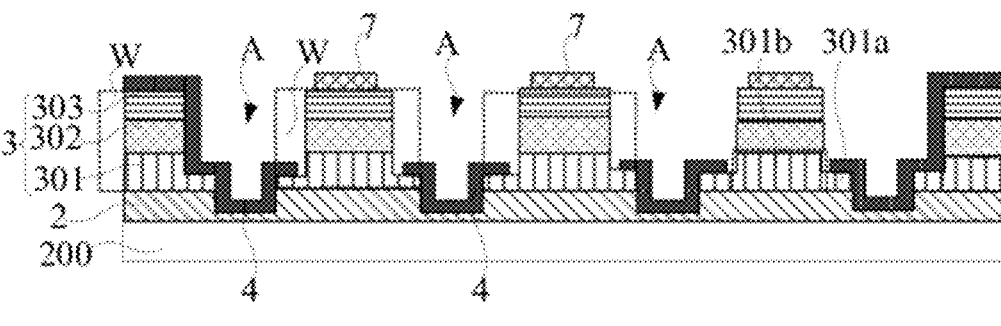
FIG. 9
FIG. 10

LIGHT-EMITTING CHIP STRUCTURE, DISPLAY DEVICE, AND METHOD FOR MANUFACTURING DISPLAY DEVICE

CROSS REFERENCE TO RELATED APPLICATIONS

The present disclosure claims priority to Chinese Patent Application No. 202320475736.9, filed on Mar. 13, 2023 in the National Intellectual Property Administration of China, the contents of which are herein incorporated by reference in their entireties.

TECHNICAL FIELD

The present disclosure relates to the field of chips technologies, in particular to a light-emitting chip structure, a display device, and a method for manufacturing a display device.

BACKGROUND

An inorganic micro light emitting diode (Micro LED) display is one of the hot spots in the field of display research today. The Micro LED display refers to a high-density integrated LED array, and each LED pixel of the Micro LED display may emit light. As a new generation of display technology, Micro LED has significant advantages over existing LCD and OLED displays, such as low energy consumption, long lifespan, no screen burn-in, high color gamut, etc.

However, if the Micro LED display device is to achieve full color, there is still a problem of light crosstalk that needs to be solved.

SUMMARY OF THE DISCLOSURE

According to a first aspect of the present disclosure, a light-emitting chip structure is provided. The light-emitting chip structure includes: a protective layer; a buffer layer, arranged on a side of the protective layer; an epitaxial layer, arranged on a side of the buffer layer and including a plurality of first gaps, wherein the epitaxial layer is divided into a plurality of epitaxial structures by the plurality of first gaps, each of the plurality of epitaxial structures includes a first semiconductor layer, a light-emitting layer, and a second semiconductor layer which are sequentially stacked on the side of the buffer layer, and a side surface of the first semiconductor layer is arranged with a protruding portion; a patterned metal layer, one part of the patterned metal layer being arranged on a bottom of each of the plurality of first gaps to cover the protruding portion and a part of the buffer layer exposed through the plurality of first gaps, and the other part of the patterned metal layer being arranged on a side surface of each of the plurality of epitaxial structures at an edge of the light-emitting chip structure and a surface of each of the plurality of epitaxial structures away from the buffer layer; a light-shielding layer, configured to cover the epitaxial layer and the patterned metal layer, and filled in the plurality of first gaps, wherein a first opening is defined at a position of the light-shielding layer corresponding to the epitaxial structure; and an electrode layer, including at least one first electrode and a plurality of second electrodes, wherein the first electrode is inserted through the first opening and electrically connected with the patterned metal layer, and the plurality of second electrodes are inserted through the first opening and electrically connected with the second semiconductor layer.

According to a second aspect of the present disclosure, a display device is provided. The display device includes a driving back plate and the above-mentioned light-emitting chip structure. The driving back plate is connected to the electrode layer in a bonding way.

According to a third aspect of the present disclosure, a method for manufacturing a display device is provided. The method for manufacturing a display device includes: disposing a buffer layer and an epitaxial layer on a substrate; etching the epitaxial layer to form a protruding portion on a first semiconductor layer, and defining a groove on the buffer layer to form a first gap; disposing a patterned metal layer on the first semiconductor layer and the buffer layer; disposing a light-shielding layer in the first gap between the epitaxial structures, and reserving a first opening at a position where the electrode layer is located; and depositing an electrode layer at a position where the first opening is located.

BRIEF DESCRIPTION OF THE DRAWINGS

In order to illustrate more clearly the technical solutions in the embodiments of the present disclosure, drawings for describing the embodiments will be described briefly in the following. Apparently, the described drawings show only some of the embodiments of the present disclosure, any ordinary skilled person in the art shall obtain other drawings without any creative work.

FIG. 6 is a schematic flow chart of a method for manufacturing a display device according to an embodiment of the present disclosure.

FIG. 7 is a specific structural schematic view corresponding to an operation S1.

FIG. 8 is a specific structural schematic view corresponding to an operation S2.

FIG. 9 is a specific structural schematic view corresponding to an operation S3.

FIG. 10 is a specific structural schematic view corresponding to an operation S4.

REFERENCE NUMBERS IN THE DRAWINGS

Figure 1:
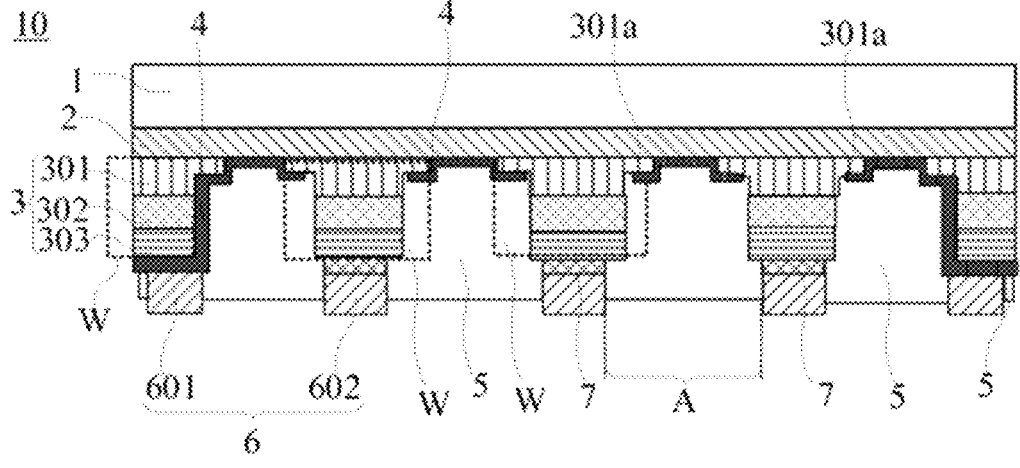
FIG. 1 is a structural schematic view of a light-emitting chip structure according to a first embodiment of the present disclosure.

1—protective layer; 2—buffer layer; 201—groove; 3—epitaxial layer; 301—first semiconductor layer;

302—light—emitting layer; 303—second semiconductor layer; 301a—protruding portion; 302a—body portion; 4—patterned metal layer; 5—light—shading layer; 6—electrode layer; 601—first electrode; 602—second electrode; 7—ohmic contact layer; 8—quantum dot layer; 9—black matrix layer; 10—light—emitting chip structure; 20—driving back plate; A—first gap; B—second gap; C—first opening; D—second opening; W—epitaxial structure; 100—display device; 200—substrate.

DETAILED DESCRIPTION

Technical solutions in the embodiments of the present disclosure will be clearly and completely described below by referring to the accompanying drawings in the embodiments of the present disclosure. Obviously, the described embodiments are only some of but not all of the embodiments of the present disclosure. Based on the embodiments in the present disclosure, all other embodiments obtained by any ordinary skilled person in the art without making creative work shall fall within the scope of the present disclosure.

Terms "first", "second" and "third" herein are used for descriptive purposes only and shall not be interpreted as indicating or implying relative importance or implicitly specifying the number of indicated technical features. Therefore, a feature defined by the "first", "second", or "third" may explicitly or implicitly include at least one such feature. In the description of the present disclosure, "a plurality of" means at least two, such as two, three, and so on, unless otherwise expressly and specifically limited. All directional indications in the present disclosure (such as up, down, left, right, front, rear, . . . ) are used only to explain relative position relationship, movement, and the like, between components at a particular posture (as shown in the drawings). When the posture is changed, the directional indications may change accordingly. In addition, terms "include" and "has" and any variations thereof are intended to cover non-exclusive inclusion. For example, a process, a method, a system, a product or an apparatus including a series of operations or units is not limited to the listed operations or units, but may further include operations or units that are not listed, or include other operations or units that are inherent to the process, the method, the product or the apparatus.

The "embodiments" of the present disclosure may mean that a particular feature, structure, or property described in an embodiment may be included in at least one embodiment of the present disclosure. Presence of the phrase at various sections in the specification does not necessarily mean a same embodiment, nor is it a separate embodiment or an alternative embodiment that is mutually exclusive with other embodiments. Any ordinary skilled person in the art shall explicitly or implicitly understand that the embodiments described herein may be combined with other embodiments.

The present disclosure will be described in details by referring to the accompanying drawings and embodiments in the following.

As shown in FIG. 1, FIG. 1 is a structural schematic view of a light-emitting chip structure according to a first embodiment of the present disclosure. In the embodiment, a light-emitting chip structure 10 is provided. The light-emitting chip structure 10 includes a protective layer 1, a buffer layer 2, an epitaxial layer 3, a patterned metal layer 4, a light-shading layer 5, and an electrode layer 6. In some embodiments, the buffer layer 2 is arranged on a side of the protective layer 1, the epitaxial layer 3 is arranged on a side of the buffer layer 2, and the epitaxial layer 3 has a plurality of first gaps A. The plurality of first gaps A divide the epitaxial layer 3 into a plurality of epitaxial structures W.

As shown in FIG. 1, each of the plurality of epitaxial structures W includes a first semiconductor layer 301, a light-emitting layer 302, and a second semiconductor layer 303, and a protruding portion 301a is arranged on a side of the first semiconductor. The first semiconductor layer 301, the light-emitting layer 302, and the second semiconductor layer 303 are sequentially stacked on the side of the buffer layer 2. In an embodiment, the first semiconductor layer 301 is a N-type layer, and the second semiconductor layer 303 is a P-type layer.

In some embodiments, the P-type layer may be a P-type GaN, and the N-type layer may be a N-type GaN.

The light-emitting layer 302 is a quantum-well active layer or an active layer. The light-emitting layer 302 may be visible light, red light, blue light, ultraviolet light and other quantum-well active layers, so as to form a visible light epitaxial structure, a red light epitaxial structure, a blue light epitaxial structure, a ultraviolet light epitaxial structure, etc., respectively. In the embodiment, the blue light epitaxial structure may be taken as an example for description.

As shown in FIG. 1, the patterned metal layer 4 includes two parts, one part of the patterned metal layer 4 is arranged on a bottom of each of the plurality of first gaps A, the plurality of first gaps A are configured to cover the protruding portion 301a and a part of the buffer layer 2 exposed through the plurality of first gaps A, and the other part of the patterned metal layer 4 is arranged on a side surface of the epitaxial structure W at an edge of the light-emitting chip structure 10 and a surface of the epitaxial structure W away from the buffer layer 2, thereby isolating the emitted light, so as to reduce light crosstalk.

A material of the patterned metal layer 4 is a metal material. In some embodiments, the patterned metal layer 4 is formed of a single material. The material of the patterned metal layer 4 may be any one or a combination of aluminum (Al), copper (Cu), silver (Ag), and other metal materials. For example, the patterned metal layer 4 may be composed of the Cu material, the Al material, or other metal materials, or the patterned metal layer 4 may be composed of a mixture of several metal materials, as long as a component of each metal in the patterned metal layer 4 of each part is the same (i.e. the same proportion). Therefore, the patterned metal layer 4 may be formed by means of a one-time-shaping method, and a method for manufacturing the patterned metal layer 4 is simple, thereby saving production time and cost. The patterned metal layer 4 may not only isolate light, but also be electrically connected with the electrode layer 6.

Figure 11:
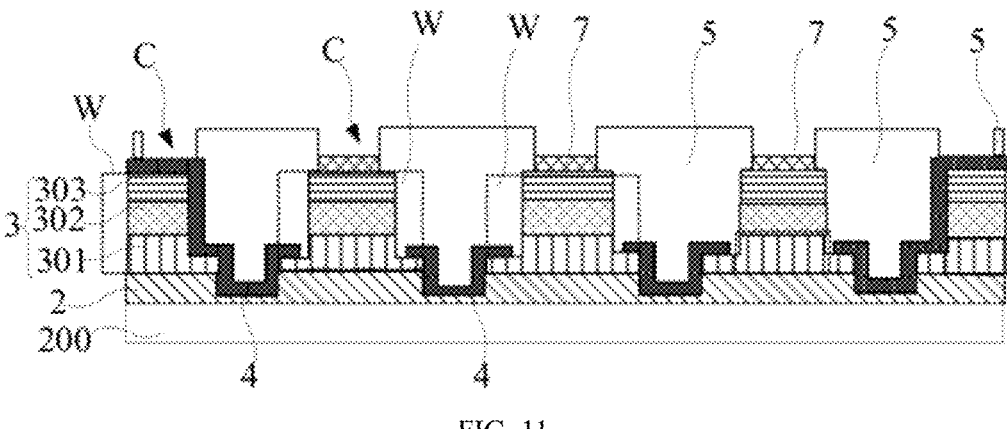
FIG. 11 is a specific structural schematic view corresponding to an operation S5.

As shown in FIG. 1, the light-shielding layer 5 covers the epitaxial layer 3 and the patterned metal layer 4, and is filled in the plurality of first gaps A. The light-shielding layer 5 is configured to further isolate the light, thereby preventing the crosstalk of light beams and reducing an adverse effect on the light-emitting layer 302. At the same time, a first opening C is defined at a position of the light-shielding layer 5 corresponding to the epitaxial structure W (as shown in FIG. 11 below).

The electrode layer 6 includes at least one first electrode 601 and a plurality of second electrodes 602. The first electrode 601 is inserted through the first opening C through and electrically connected with the patterned metal layer 4. The plurality of second electrode 602 are inserted through the first opening C through and electrically connected with the second semiconductor layer 303.

In the embodiment, the light-emitting chip structure 10 further includes an ohmic contact layer 7. As shown in FIG. 1, the ohmic contact layer 7 is arranged between the second electrode 602 and the second semiconductor layer 303, thereby improving an electrical contact performance of the second semiconductor layer 303.

Figure 2:
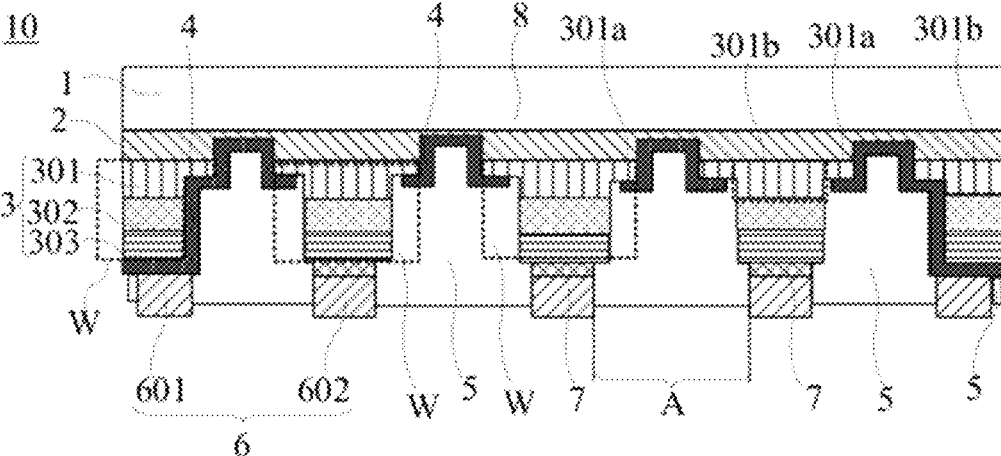
FIG. 2 is a structural schematic view of the light-emitting chip structure according to a second embodiment of the present disclosure.

As shown in FIG. 2, FIG. 2 is a structural schematic view of the light-emitting chip structure according to a second embodiment of the present disclosure. In the embodiment, the light-emitting chip structure 10 further includes a groove 201 (as shown in FIG. 8 below). The groove 201 is defined on a surface of the buffer layer 2 exposed through the first gap A. In the embodiment, the surface of the buffer layer 2 exposed through the first gap A is recessed overall to form the groove 201. In some embodiments, a distance between the protruding portions 301*a* of different epitaxial structures W is the same as a width of the groove 201.

As shown in FIG. 2, the one part of the patterned metal layer 4 covers a bottom and a side surface of the groove 201, and the other part of the patterned metal layer 4 is arranged on the side surface of the epitaxial structure W at the edge of the light-emitting chip structure 10 and the surface of the epitaxial structure W away from the buffer layer 2, thereby isolating the emitted light, so as to reduce the light crosstalk.

In some embodiments, the first semiconductor layer 301 includes a protruding portion 301*a* and a body portion 301*b*. The body portion 301*b* is disposed between the light-emitting layer 302 and the buffer layer 2, and the protruding portion 301*a* is disposed on a side surface of the body portion 301*b*.

In some embodiments, a thickness of the protruding portion 301*a* is less than a thickness of the main body portion 301*b*.

Figure 3:
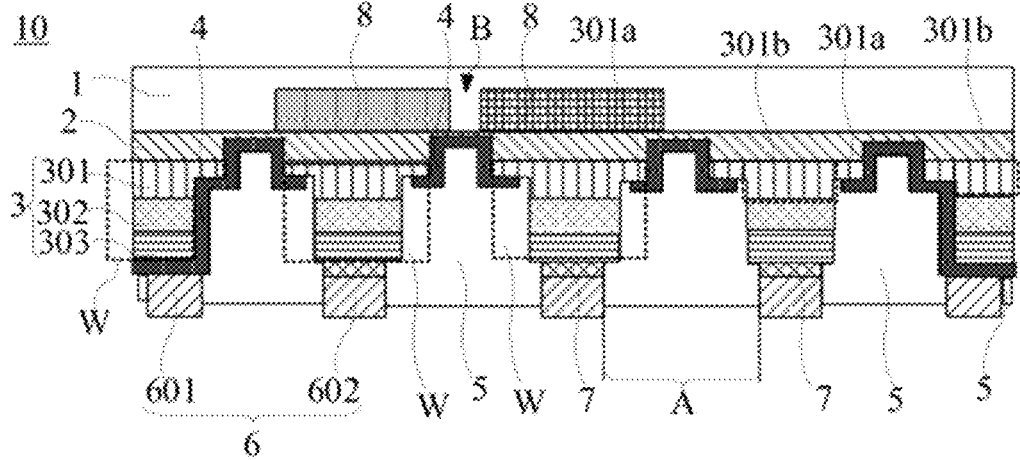
FIG. 3 is a structural schematic view of the light-emitting chip structure according to a third embodiment of the present disclosure.

As shown in FIG. 3, FIG. 3 is a structural schematic view of the light-emitting chip structure according to a third embodiment of the present disclosure. In the embodiment, the light-emitting chip structure 10 further includes a plurality of quantum dot layers 8. The plurality of quantum dot layers 8 are arranged between the protective layer 1 and the buffer layer 2, and are arranged corresponding to the epitaxial structure W. In some embodiments, the quantum dot layer 8 may be a red quantum dot layer, a green quantum dot layer, or a blue quantum dot layer, thereby achieving full color display. In the embodiment, the blue light epitaxial structure may be taken as an example for description, and the quantum dot layer 8 of the light-emitting chip structure 10 includes the red quantum dot layer and the green quantum dot layer to achieve full color display.

Figure 4:
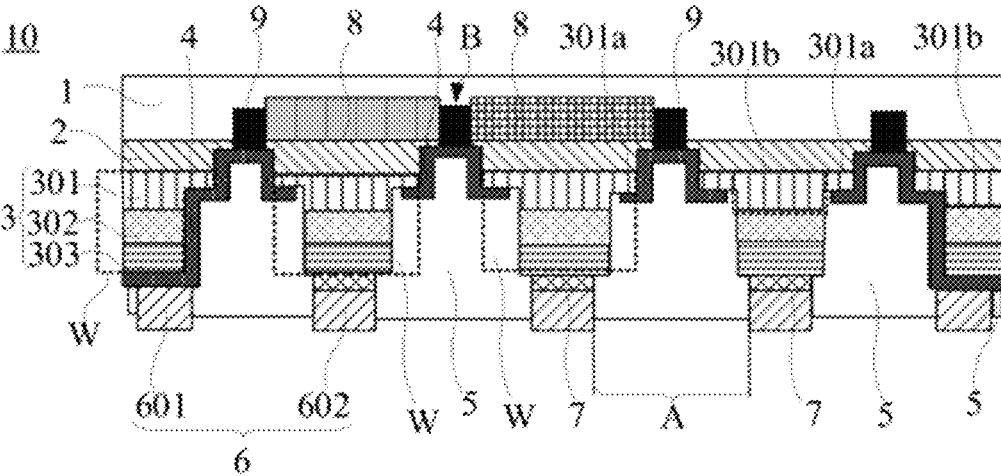
FIG. 4 is a structural schematic view of the light-emitting chip structure according to a fourth embodiment of the present disclosure.
Figure 14:
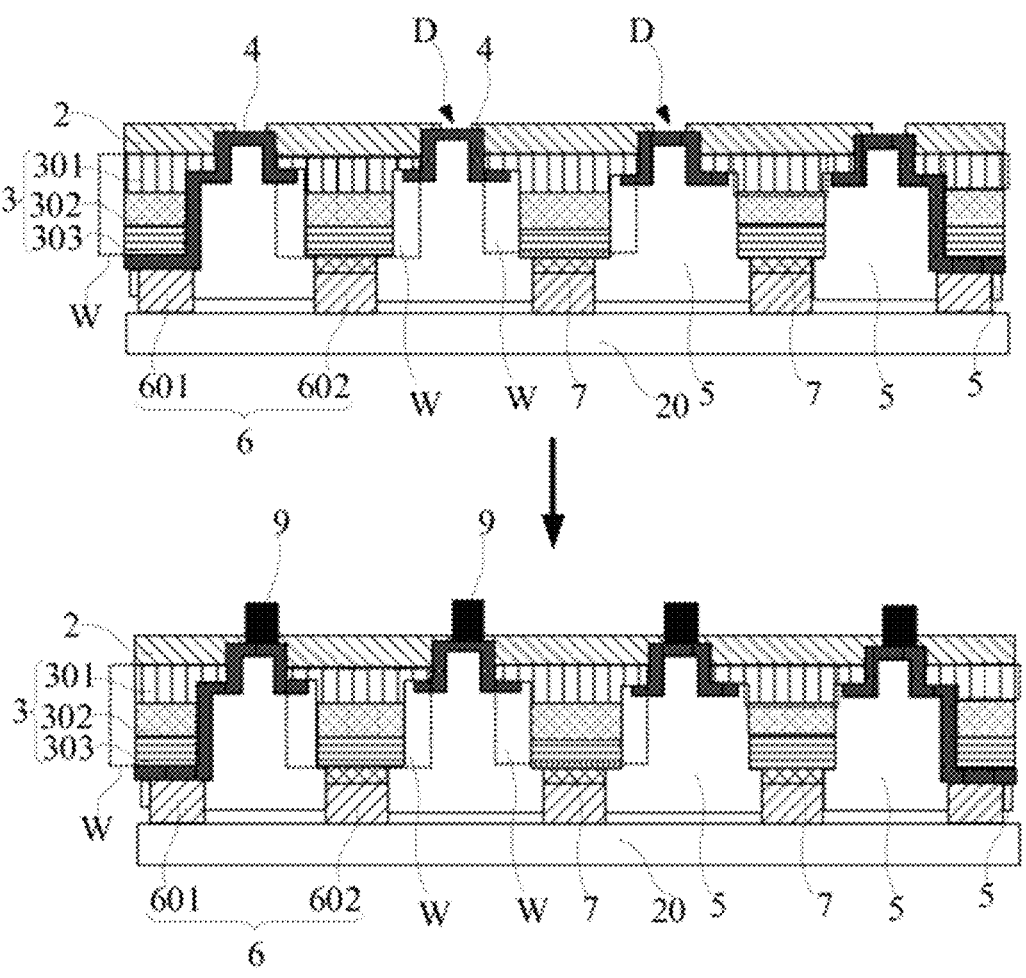
FIG. 14 is a specific structural schematic view corresponding to an operation S8.

As shown in FIG. 4, FIG. 4 is a structural schematic view of the light-emitting chip structure according to a fourth embodiment of the present disclosure. The light-emitting chip structure 10 further includes a black matrix layer 9. The black matrix layer 9 is arranged on a side of the protective layer 1 close to the buffer layer 2 and is disposed in the second gap B between adjacent quantum dot layers 8. As shown in FIG. 1, a second opening D is defined at a position of the buffer layer 2 corresponding to the first gap A (as shown in FIG. 14 below), and the black matrix layer 9 passes through the second opening D and contacts the patterned metal layer 4. In some embodiments, a surface of the quantum dot layer 8 away from the epitaxial layer 3 is higher than or flush with a surface of the black matrix layer 9 away from the epitaxial layer 3. A material of the black matrix layer 9 may include one or more materials such as Cr and black resin. Of course, and embodiments of the present disclosure are not limited here, and all materials with shading function are within the protection scope of the present disclosure. The black matrix layer 9 is configured to shade light to reduce phenomena of light leakage and light crosstalk.

It should be understood by one skilled in the art that, in order to facilitate detailed description, in the following embodiments, a structure of the light-emitting chip structure 10 (as shown in FIG. 4) according to the fourth embodiment of the present disclosure is mainly taken as an example for description.

Figure 5:
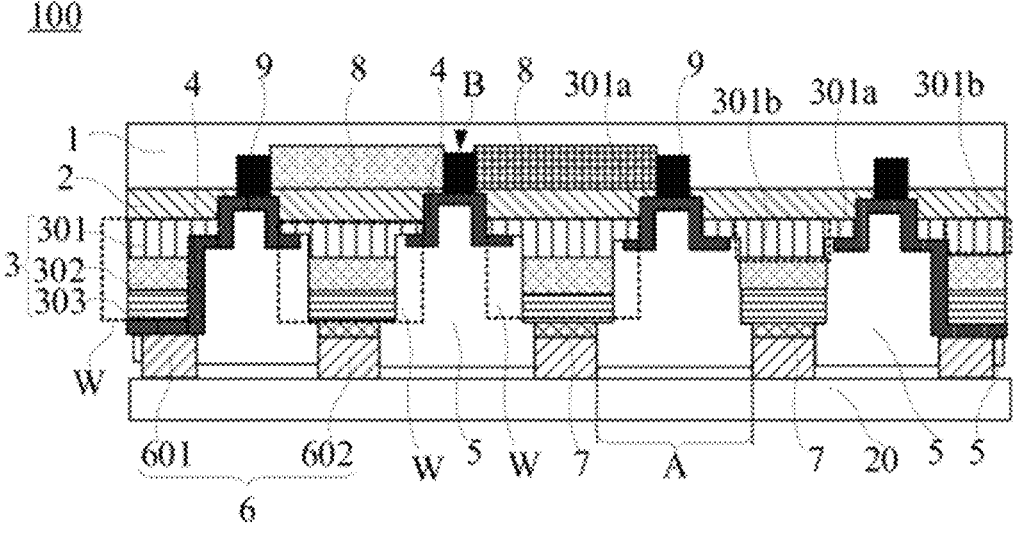
FIG. 5 is a structural schematic view of a display device according to an embodiment of the present disclosure.

As shown in FIG. 5, FIG. 5 is a structural schematic view of a display device according to an embodiment of the present disclosure. In the embodiment, a display device 100 is provided. The display device 100 includes the light-emitting chip structure 10 described in any of the above embodiments and a driving back plate 20, and the driving back plate 10 is connected to the electrode layer 6 in a bonding way. A specific structure and function of the light-emitting chip structure 10 may be referred to the description of relevant embodiments of the light-emitting chip structure 10 in the above, which will not be repeated here. The display device 100 may be a desktop computer, a laptop, a mobile phone, a TV, etc., and may be configured to display images during work. FIG. 5 is further shown mainly based on the structure of the light-emitting chip structure 10 according to the fourth embodiment of the present disclosure.

The light-emitting chip structure 10 and the display device 100 are provided by the present disclosure. The light-emitting chip structure 10 includes the protective layer 1, the buffer layer 2, the epitaxial layer 3, the patterned metal layer 4, the light-shielding layer 5, and the electrode layer 6. The light-emitting chip structure 10 further includes the quantum dot layer 8 and the black matrix layer 9. The epitaxial layer 3 is divided into the plurality of epitaxial structures W through the first gap A. The patterned metal layer 4 is configured to cover the protruding portion 301*a*, the part of the buffer layer 2 exposed through the plurality of first gaps A, the side surface of the epitaxial structure W at the edge of the light-emitting chip structure 10, and the surface of the epitaxial structure W away from the buffer layer 2, such that the light emitted by the light-emitting layer 302 may be isolated, thereby reducing the light crosstalk. The light-shielding layer 5 covers the epitaxial layer 3 and the patterned metal layer 4, and is filled in the plurality of first gaps A, so as to physically shade the light, and thus it may be possible to further isolate the light, solve the problem of light crosstalk, and improve light-emitting efficiency. The black matrix layer 9 is filled in the second gap B between the adjacent quantum dot layers 8 to shade the light, thereby reducing the phenomena of light leakage and light crosstalk. In some embodiments, the patterned metal layer 4 is a first layer which is configured to isolate the light, the light-shielding layer 5 is a second layer which is configured to isolate the light, and the black matrix layer 9 is a third layer which is configured to isolate the light. In some embodiments of the present disclosure, by arranging three layers configured to isolate the light, the light emitted from the light-emitting layer 302 to an optical path of the quantum dot layer 8 may be isolated, and thus the problem of light crosstalk is completely solved.

As shown in FIG. 6, FIG. 6 is a schematic flow chart of a method for manufacturing the display device according to an embodiment of the present disclosure. It should be understood by one skilled in the art that, four different light-emitting chip structures 10 are provided according to the above embodiments of the present disclosure. In order to facilitate detailed description, the structure of the light-emitting chip structure 10 provided in the fourth embodiment of the present disclosure is taken as an example to describe the method for manufacturing the display device.

A method for manufacturing the display device is further provided by the present disclosure, and the method may include following operations.

At an operation S1, a buffer layer and an epitaxial layer are disposed or formed on a substrate.

As shown in FIG. 7, FIG. 7 is a specific structural schematic view corresponding to an operation S1. In some embodiments, a substrate 200 may be a sapphire substrate, a GaAs substrate, or a S1 substrate, etc. A buffer layer 2 is disposed or formed on a side of the substrate 200. A first semiconductor layer 301, a light-emitting layer 302, and a second semiconductor layer 303 are sequentially stacked on a side of the buffer layer 2 away from the substrate 200. The first semiconductor layer 301, the light-emitting layer 302, and the second semiconductor layer 303 form an epitaxial layer 3.

At an operation S2, the epitaxial layer is etched to form a protruding portion 301a on the first semiconductor layer, and a groove is formed on the buffer layer to form a first gap.

As shown in FIG. 8. FIG. 8 is a specific structural schematic view corresponding to an operation S2. In some embodiments, the external extension layer 3 is etched through a yellow light process. Firstly, the first semiconductor layer 301 is etched, and then the protruding portion 301a is formed by etching the first semiconductor layer 301 through the yellow light process, until the buffer layer 2 is etched to form a groove 201 in the buffer layer 2. The epitaxial layer 3 is divided into a plurality of epitaxial structures W by the formed first gap A. In some embodiments, the groove 201 is not a through groove, that is, the buffer layer 2 is not fully cut through during an etching process, and the buffer layer 2 is covered with the epitaxial layer 3, so as to protect a patterned metal layer 4 from damage in a process of taking out the substrate 200 in the following an operation S7.

In some embodiments, a distance between protruding portions 301a of different epitaxial structures W is the same as a width of the groove 201.

At an operation S3, a patterned metal layer is disposed or formed on the first semiconductor layer and the buffer layer.

As shown in FIG. 9, FIG. 9 is a specific structural schematic view corresponding to an operation S3. In some embodiments, the patterned metal layer 4 is a first layer which is configured to isolate the light. The patterned metal layer 4 includes two parts, one part of the patterned metal layer 4 is arranged on a bottom of each of the plurality of first gaps A to cover the protruding portion 301a and a part of the buffer layer 2 exposed through the plurality of first gaps A. In some embodiments, the one part of the patterned metal layer 4 covers a bottom and a side face of the groove 201 (as shown in FIG. 8 above). The other part of the patterned metal layer 4 is arranged on a side of the epitaxial structure W at an edge of the light-emitting chip structure 10 and a surface away from the buffer layer 2, so as to isolate emitted light and reduce light crosstalk. A material of the patterned metal layer 4 may be any one or a combination of aluminum (Al), copper (Cu), silver (Ag), and other metal materials. For example, the patterned metal layer 4 may be composed of the Cu material, the Al material, or other metal materials, or the patterned metal layer 4 may be composed of a mixture of several metal materials, as long as a component of each metal in the patterned metal layer 4 of each part is the same (i.e. the same proportion). Therefore, the patterned metal layer 4 may be formed by means of a one-time-shaping method, and a method for manufacturing the patterned metal layer 4 is simple, thereby saving production time and cost.

At an operation S4, an ohmic contact layer is disposed or formed on the second semiconductor layer.

As shown in FIG. 10, FIG. 10 is a specific structural schematic view corresponding to an operation S4. In some embodiments, an ohmic contact layer 7 is arranged on the second semiconductor layer 303 to improve an electrical contact performance of the second semiconductor layer 303.

At an operation S5, a light-shielding layer is disposed or formed in the first gap between the epitaxial structures, and a first opening is reserved at a position where the electrode layer is located.

As shown in FIG. 11, FIG. 11 is a specific structural schematic view corresponding to an operation S5. In some embodiments, the light-shielding layer 5 covers the epitaxial layer 3 and the patterned metal layer 4, and is filled in the plurality of first gaps A. The light-shielding layer 5 is a second layer which is configured to isolate the light, so as to further isolate the light, thereby preventing the crosstalk of light beams and reducing an adverse effect on the light-emitting layer 302. At the same time, a first opening C is defined at a position of the light-shielding layer 5 corresponding to the epitaxial structure W At an operation S6, an electrode layer is deposited at a position where the first opening is located.

Figure 12:
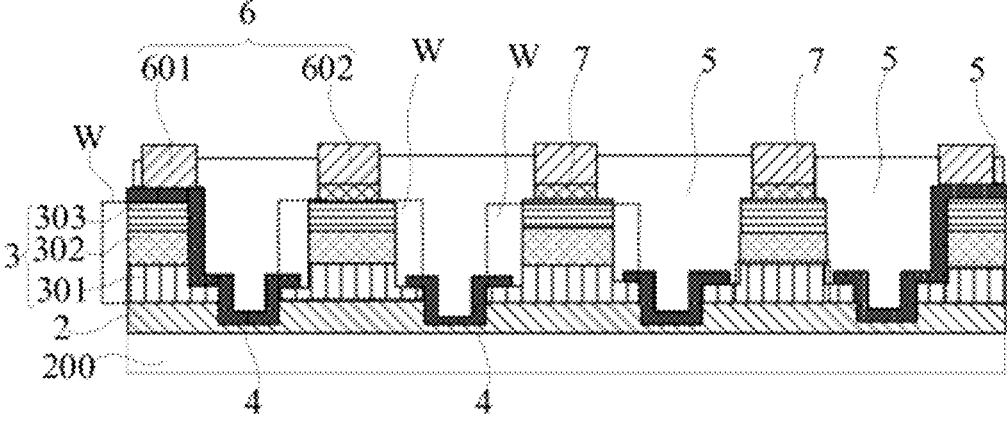
FIG. 12 is a specific structural schematic view corresponding to an operation S6.

As shown in FIG. 12, FIG. 12 is a specific structural schematic view corresponding to an operation S6. The electrode layer 6 includes one first electrode 601 and a plurality of second electrodes 602. The first electrode 601 is inserted through the first opening C through and electrically connected with the patterned metal layer 4. The plurality of second electrode 602 are inserted through the first opening C through and electrically connected with the second semiconductor layer 303. In some embodiments, the electrode layer 6 is configured to be connected with the driving back plate 20 in a bonding way.

At an operation S7, a structure obtained in an operation S6 is flipped and bonded, and is connected with to the driver backplane in the bonding way, and then the substrate is removed.

Figure 13:
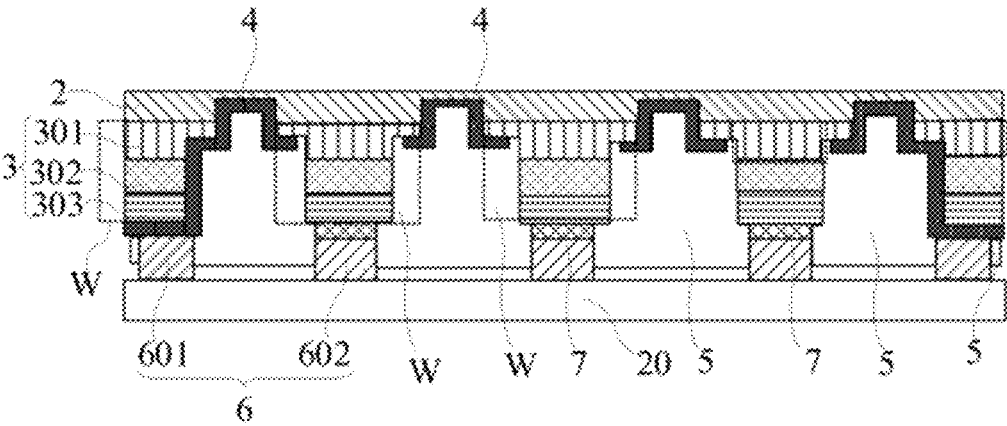
FIG. 13 is a specific structural schematic view corresponding to an operation S7.

As shown in FIG. 13, FIG. 13 is a specific structural schematic view corresponding to an operation S7.

At an operation S8, a second opening is formed on a side of the buffer layer facing the patterned metal layer, and a black matrix layer is filled in the second opening.

As shown in FIG. 14, FIG. 14 is a specific structural schematic view corresponding to an operation S8. In some embodiments, a black matrix layer 9 is arranged on a side of the protective layer 1 close to buffer layer 2. The buffer layer 2 defines a second opening D. The black matrix layer 9 passes through the second opening D and contacts the patterned metal layer 4. The black matrix layer 9 is a third layer which is configured to isolate the light, so as to further isolate the light, thereby reducing the phenomena of light leakage and light crosstalk.

At an operation S9, a quantum dot layer and a protective layer are disposed or formed on a structure obtained in an operation S8.

Figure 15:
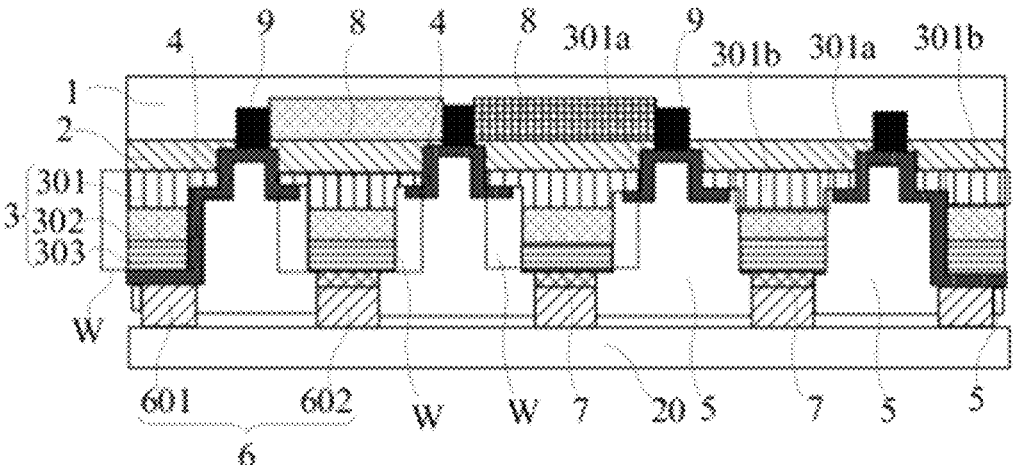
FIG. 15 is a specific structural schematic view corresponding to an operation S9.

As shown in FIG. 15, FIG. 15 is a specific structural schematic view corresponding to an operation S9. In some embodiments, a quantum dot layer 8 is disposed or formed between black matrix layers. The quantum dot layer 8 is arranged between the protective layer 1 and the buffer layer 2, and is arranged corresponding to the epitaxial structure W. In some embodiments, a surface of the quantum dot layer 8 away from the epitaxial layer 3 is higher than or flush with a surface of the black matrix layer 9 away from the epitaxial layer 3.

In some embodiments, the quantum dot layer 8 may be a red quantum dot layer, a green quantum dot layer, or a blue quantum dot layer, thereby achieving full color display. In the embodiment, the blue light epitaxial structure may be taken as an example for description, and the quantum dot layer 8 of the light-emitting chip structure 10 includes the red quantum dot layer and the green quantum dot layer to achieve full color display.

According to a first aspect of the present disclosure, a light-emitting chip structure is provided. The light-emitting chip structure includes: a protective layer; a buffer layer, arranged on a side of the protective layer; an epitaxial layer, arranged on a side of the buffer layer and including a plurality of first gaps, wherein the epitaxial layer is divided into a plurality of epitaxial structures by the plurality of first gaps, each of the plurality of epitaxial structures includes a first semiconductor layer, a light-emitting layer, and a second semiconductor layer which are sequentially stacked on the side of the buffer layer, and a side surface of the first semiconductor layer is arranged with a protruding portion; a patterned metal layer, one part of the patterned metal layer being arranged on a bottom of each of the plurality of first gaps to cover the protruding portion and a part of the buffer layer exposed through the plurality of first gaps, and the other part of the patterned metal layer being arranged on a side surface of each of the plurality of epitaxial structures at an edge of the light-emitting chip structure and a surface of each of the plurality of epitaxial structures away from the buffer layer; a light-shielding layer, configured to cover the epitaxial layer and the patterned metal layer, and filled in the plurality of first gaps, wherein a first opening is defined at a position of the light-shielding layer corresponding to the epitaxial structure; and an electrode layer, including at least one first electrode and a plurality of second electrodes, wherein the first electrode is inserted through the first opening and electrically connected with the patterned metal layer, and the plurality of second electrodes are inserted through the first opening and electrically connected with the second semiconductor layer.

In some embodiments, the first semiconductor layer includes a body portion disposed between the light-emitting layer and the buffer layer and the protruding portion disposed on a side surface of the body portion, and a thickness of the protruding portion is less than a thickness of the body portion.

In some embodiments, a groove is defined on a surface of the buffer layer exposed through the first gap, and the patterned metal layer covers a bottom surface and a side surface of the groove.

In some embodiments, the surface of the buffer layer exposed through the first gap is recessed overall to form the groove.

In some embodiments, a distance between the protruding portions of different epitaxial structures is the same as a width of the groove.

In some embodiments, the patterned metal layer is formed of a single material.

In some embodiments, the first semiconductor layer is a N-type layer, the second semiconductor layer is a P-type layer, and an ohmic contact layer is further arranged between the P-shaped layer and the second electrode.

In some embodiments, the light-emitting chip structure further includes: a plurality of quantum dot layers, arranged between the protective layer and the buffer layer, and corresponding to the epitaxial structure.

In some embodiments, the quantum dot layer comprises a red quantum dot layer and a green quantum dot layer.

In some embodiments, the light-emitting chip structure further includes: a black matrix layer, arranged on a side of the protective layer close to the buffer layer and disposed in a second gap between adjacent quantum dot layers.

In some embodiments, a material of the black matrix layer comprises at least one of Cr and black resin.

In some embodiments, a second opening is defined on a position of the buffer layer corresponding to the first gap, the black matrix layer passes through the second opening and contacts the patterned metal layer, and a surface of the quantum dot layer away from the epitaxial layer is higher than or flush with a surface of the black matrix layer away from the epitaxial layer.

In some embodiments, a material of the patterned metal layer is any one or a combination of aluminum, copper, and silver.

In some embodiments, the light-emitting layer is a quantum-well active layer or an active layer.

According to a second aspect of the present disclosure, a display device is provided. The display device includes a driving back plate and the above-mentioned light-emitting chip structure. The driving back plate is connected to the electrode layer in a bonding way.

According to a third aspect of the present disclosure, a method for manufacturing a display device is provided. The method for manufacturing a display device includes: disposing a buffer layer and an epitaxial layer on a substrate; etching the epitaxial layer to form a protruding portion on a first semiconductor layer, and defining a groove on the buffer layer to form a first gap; disposing a patterned metal layer on the first semiconductor layer and the buffer layer; disposing a light-shielding layer in the first gap between the epitaxial structures, and reserving a first opening at a position where the electrode layer is located; and depositing an electrode layer at a position where the first opening is located.

In some embodiments, the disposing a buffer layer and an epitaxial layer on a substrate includes: disposing the buffer layer on a side of the substrate; and stacking a first semiconductor layer, a light-emitting layer, and a second semiconductor layer sequentially on a side of the buffer layer away from the substrate. The epitaxial layer comprises the first semiconductor layer, the light-emitting layer, and the second semiconductor layer.

In some embodiments, the method further includes: defining a second opening on a side of the buffer layer facing the patterned metal layer, and filling a black matrix layer in a second opening.

In some embodiments, the method further includes: disposing a quantum dot layer between black matrix layers; and disposing a protective layer. The quantum dot layer is arranged between the protective layer and the buffer layer.

For those skilled in the art, it is obvious that the present disclosure is not limited to the details of the above exemplary embodiments, and the present disclosure may be realized in other specific forms without departing from the spirit and basic features of the present disclosure. Therefore, from any point of view, the embodiments should be regarded as an exemplary and non-limiting embodiment. The scope of the present disclosure is defined by the attached claims rather than the above description, and it is intended to include all changes within the meaning and scope of similar elements of claims of the present disclosure. Any reference numbers in the claims shall not be regarded as limiting claims involved.

The above description shows only embodiments of the present disclosure and does not limit the scope of the present disclosure. Any equivalent structure or equivalent process transformation performed based on the description and the accompanying drawings of the present disclosure, applied directly or indirectly in other related fields, shall be equally covered by the scope of the present disclosure.

What is claimed is:

1. A light-emitting chip structure, comprising:
a protective layer;
a buffer layer, arranged on a side of the protective layer;
an epitaxial layer, arranged on a side of the buffer layer and comprising a plurality of first gaps, wherein the epitaxial layer is divided into a plurality of epitaxial structures by the plurality of first gaps, each of the plurality of epitaxial structures comprises a first semiconductor layer, a light-emitting layer, and a second semiconductor layer which are sequentially stacked on the side of the buffer layer, and a side surface of the first semiconductor layer is arranged with a protruding portion;
a patterned metal layer, one part of the patterned metal layer being arranged on a bottom of each of the plurality of first gaps to cover the protruding portion and a part of the buffer layer exposed through the plurality of first gaps, and the other part of the patterned metal layer being arranged on a side surface of each of the plurality of epitaxial structures at an edge of the light-emitting chip structure and a surface of each of the plurality of epitaxial structures away from the buffer layer;
a light-shielding layer, configured to cover the epitaxial layer and the patterned metal layer, and filled in the plurality of first gaps, wherein a first opening is defined at a position of the light-shielding layer corresponding to the epitaxial structure; and
an electrode layer, comprising at least one first electrode and a plurality of second electrodes, wherein the first electrode is inserted through the first opening and electrically connected with the patterned metal layer, and the plurality of second electrodes are inserted through the first opening and electrically connected with the second semiconductor layer;
wherein a groove is defined on a surface of the buffer layer exposed through the first gap, and the patterned metal layer covers a bottom surface and a side surface of the groove.

2. The light-emitting chip structure according to claim 1, wherein the first semiconductor layer comprises a body portion disposed between the light-emitting layer and the buffer layer and the protruding portion disposed on a side surface of the body portion, and a thickness of the protruding portion is less than a thickness of the body portion.

3. The light-emitting chip structure according to claim 1, wherein the surface of the buffer layer exposed through the first gap is recessed overall to form the groove.

4. The light-emitting chip structure according to claim 1, wherein a distance between the protruding portions of different epitaxial structures is the same as a width of the groove.

5. The light-emitting chip structure according to claim 1, wherein the patterned metal layer is formed of a single material.

6. The light-emitting chip structure according to claim 1, wherein the first semiconductor layer is a N-type layer, the second semiconductor layer is a P-type layer, and an ohmic contact layer is further arranged between the P-shaped layer and the second electrode.

7. The light-emitting chip structure according to claim 1, further comprising: a plurality of quantum dot layers, arranged between the protective layer and the buffer layer, and corresponding to the epitaxial structure.

8. The light-emitting chip structure according to claim 7, wherein the quantum dot layer comprises a red quantum dot layer and a green quantum dot layer.

9. The light-emitting chip structure according to claim 7, further comprising: a black matrix layer, arranged on a side of the protective layer close to the buffer layer and disposed in a second gap between adjacent quantum dot layers.

10. The light-emitting chip structure according to claim 9, wherein a material of the black matrix layer comprises at least one of Cr and black resin.

11. The light-emitting chip structure according to claim 9, wherein a second opening is defined on a position of the buffer layer corresponding to the first gap, the black matrix layer passes through the second opening and contacts the patterned metal layer, and a surface of the quantum dot layer away from the epitaxial layer is higher than or flush with a surface of the black matrix layer away from the epitaxial layer.

12. The light-emitting chip structure according to claim 1, wherein a material of the patterned metal layer is any one or a combination of aluminum, copper, and silver.

13. The light-emitting chip structure according to claim 1, wherein the light-emitting layer is a quantum-well active layer or an active layer.

14. A display device, comprising: a driving back plate and a light-emitting chip structure; wherein,
the light-emitting chip structure comprises:
a protective layer;
a buffer layer, arranged on a side of the protective layer;
an epitaxial layer, arranged on a side of the buffer layer and comprising a plurality of first gaps, wherein the epitaxial layer is divided into a plurality of epitaxial structures by the plurality of first gaps, each of the plurality of epitaxial structures comprises a first semiconductor layer, a light-emitting layer, and a second semiconductor layer which are sequentially stacked on the side of the buffer layer, and a side surface of the first semiconductor layer is arranged with a protruding portion;
a patterned metal layer, one part of the patterned metal layer being arranged on a bottom of each of the plurality of first gaps to cover the protruding portion and a part of the buffer layer exposed through the plurality of first gaps, and the other part of the patterned metal layer being arranged on a side surface of each of the plurality of epitaxial structures at an edge of the light-emitting chip structure and a surface of each of the plurality of epitaxial structures away from the buffer layer;
a light-shielding layer, configured to cover the epitaxial layer and the patterned metal layer, filled in the plurality of first gaps, wherein a first opening is defined at a position of the light-shielding layer corresponding to the epitaxial structure; and
an electrode layer, comprising at least one first electrode and a plurality of second electrodes, wherein the first electrode is inserted through the first opening and electrically connected with the patterned metal layer, and the plurality of second electrodes are inserted through the first opening and electrically connected with the second semiconductor layer;

the driving back plate is connected to the electrode layer in a bonding way;

wherein a groove is defined on a surface of the buffer layer exposed through the first gap, and the patterned metal layer covers a bottom surface and a side surface of the groove.

15. The display device according to claim 14, wherein the light-emitting chip structure further comprises: a black matrix layer, arranged on a side of the protective layer close to the buffer layer and disposed in a second gap between adjacent quantum dot layers.

16. A method for manufacturing a display device, comprising:

disposing a buffer layer and an epitaxial layer on a substrate;

etching the epitaxial layer to form a protruding portion on a first semiconductor layer, and defining a groove on the buffer layer to form a first gap;

disposing a patterned metal layer on the first semiconductor layer and the buffer layer;

disposing a light-shielding layer in the first gap between the epitaxial structures, and reserving a first opening at a position where the electrode layer is located;

depositing an electrode layer at a position where the first opening is located; and defining a second opening on a side of the buffer layer facing the patterned metal layer, and filling a black matrix layer in the second opening.

17. The method according to claim 16, wherein the disposing a buffer layer and an epitaxial layer on a substrate comprises:

disposing the buffer layer on a side of the substrate; and stacking a first semiconductor layer, a light-emitting layer, and a second semiconductor layer sequentially on a side of the buffer layer away from the substrate;

wherein the epitaxial layer comprises the first semiconductor layer, the light-emitting layer, and the second semiconductor layer.

18. The method according to claim 8, further comprising:

disposing a quantum dot layer between black matrix layers; and disposing a protective layer;

wherein the quantum dot layer is arranged between the protective layer and the buffer layer.

\* \* \* \* \*